United States Patent
Dong et al.

(10) Patent No.: US 11,638,388 B2
(45) Date of Patent: Apr. 25, 2023

(54) HIGH-RESOLUTION SHADOW MASKS

(71) Applicant: The Hong Kong University of Science and Technology, Hong Kong (CN)

(72) Inventors: Shoucheng Dong, Hong Kong (CN); Yibin Jiang, Hong Kong (CN); Siu Ting Tam, Hong Kong (CN); Lei Lu, Hong Kong (CN); Ching Wan Tang, Hong Kong (CN)

(73) Assignee: The Hong Kong University of Science and Technology, Hong Kong (CN)

( * ) Notice: Subject to any disclaimer, the term of this patent is extended or adjusted under 35 U.S.C. 154(b) by 0 days.

(21) Appl. No.: 17/244,986

(22) Filed: Apr. 30, 2021

(65) Prior Publication Data
US 2021/0359210 A1 Nov. 18, 2021

Related U.S. Application Data

(60) Provisional application No. 63/101,831, filed on May 15, 2020, provisional application No. 63/204,968, filed on Nov. 5, 2020.

(51) Int. Cl.
*C23C 14/04* (2006.01)
*G03F 7/16* (2006.01)
(Continued)

(52) U.S. Cl.
CPC ......... *H10K 71/166* (2023.02); *B05C 21/005* (2013.01); *C23C 14/042* (2013.01);
(Continued)

(58) Field of Classification Search
None
See application file for complete search history.

(56) References Cited

U.S. PATENT DOCUMENTS 9,142,779 B2    9/2015  Chan et al.
10,947,616 B2*  3/2021  Takeda ................... C23C 14/24
(Continued)

FOREIGN PATENT DOCUMENTS

JP    2006188732 A    7/2006

OTHER PUBLICATIONS

Marc A.F. Van Den Boogaart et al., "Corrugated membranes for improved pattern definition with micro/nanostencil lithography," Sensors and Actuators A 130-131, 2006, pp. 568-574.
(Continued)

*Primary Examiner* — Jethro M. Pence
(74) *Attorney, Agent, or Firm* — Idea Intellectual Limited; Margaret A. Burke; Sam T. Yip

(57) ABSTRACT

A shadow mask for patterned vapor deposition of an organic light-emitting diode (OLED) material includes a ceramic membrane under tensile stress with a plurality of through-apertures forming an aperture array through which a vaporized deposition material can pass. A multilayer peripheral support is attached to a rear surface with a hollow portion beneath the aperture array. A compressively-stressed interlayer balances the tensile stress of the ceramic membrane. A shadow mask module with multiple shadow masks is also provided and includes a rigid carrier having plural windows with a shadow mask positioned in each window. To make the module, shadow mask blanks are affixed to each carrier window followed by etching of apertures and support layers. In this way extremely flat masks with precise aperture patterns are formed.

21 Claims, 24 Drawing Sheets

(51) Int. Cl.
  *G03F 7/11* (2006.01)
  *G03F 7/004* (2006.01)
  *G03F 7/00* (2006.01)
  *B05C 21/00* (2006.01)

(52) U.S. Cl.
  CPC .......... *G03F 7/0035* (2013.01); *G03F 7/0041* (2013.01); *G03F 7/11* (2013.01); *G03F 7/161* (2013.01); *G03F 7/167* (2013.01); *H10K 71/00* (2023.02); *H10K 71/233* (2023.02)

(56) References Cited

U.S. PATENT DOCUMENTS

| | | | |
|---|---|---|---|
| 2005/0019968 A1* | 1/2005 | Kuwahara | C23C 14/042 438/26 |
| 2015/0041793 A1* | 2/2015 | Chan | H01L 51/0018 438/35 |
| 2021/0156020 A1* | 5/2021 | Takeda | H01L 51/0011 |
| 2022/0081753 A1* | 3/2022 | Son | C23C 14/50 |

OTHER PUBLICATIONS

Office Action of the corresponding Korean patent application No. 10-2021-0063466 dated Jan. 2, 2023.

\* cited by examiner

HIGH-RESOLUTION SHADOW MASKS

CROSS-REFERENCE TO RELATED APPLICATIONS

This application claims priorities from (1) U.S. provisional patent application No. 63/101,831 filed May 15, 2020; and (2) U.S. provisional patent application No. 63/204,968 filed Nov. 5, 2020, and the disclosures of which are incorporated herein by reference in their entirety.

FIELD OF THE INVENTION

The present invention generally relates to shadow masks and, more particularly, to high resolution shadow masks that can be used for patterned vapor deposition of an organic light-emitting diode (OLED) material. The shadow masks are thin and flat due to balanced film stresses.

BACKGROUND OF THE INVENTION

Shadow masking is an important patterning technique in the manufacturing of semiconductor devices. In this process, materials to be patterned are evaporated or sublimed into vapor phase and subsequently deposited onto a substrate through a shadow mask with specific aperture patterns that allow the material vapor to pass through. Fine shadow masking is of particular significance in the manufacture of full-color OLED displays. OLED display fabrication involves the formation of patterned self-emitting organic thin films to produce individual red, green, and blue (RGB) colors. OLED was first invented in 1987 at Kodak research labs and sparked extensive research efforts worldwide. After more than 30 years of development, OLED has evolved into a practical display technology and is widely adopted in consumer electronics, such as cellphones, televisions, and wearable devices.

The premium display quality of OLED is particularly suited for virtual reality (VR) and augmented reality (AR) applications. VR and AR require near-eye displays of ultra-high resolution. To avoid the screen-door effect, where individual pixels on the display panel become visible to human eye, the display for VR/AR devices should have a pixel density of 1000 ppi (pixel per inch) or higher. In comparison, the pixel density of commercial RGB side-by-side OLED displays is typically a few hundred ppi. For example, the OLED display in the Apple iPhone XS has a pixel density of 458 ppi and the OLED display in the Samsung Galaxy S9 smartphone has 570 ppi. Further increase of the pixel density of RGB side-by-side OLED displays to meet the requirement of VR/AR has proven difficult due to limitations in the shadow mask technology.

Current OLED displays with side-by-side RGB configurations are predominately produced by vacuum thermal evaporation (VTE) with a shadow mask. In this process, an OLED emitter material, e.g., for the red color, is deposited onto a substrate containing the thin film transistor backplane through a shadow mask to form an array of red subpixels. A full-color display with all three arrays of RGB subpixels is produced by repeating the deposition process with the green and blue color emitter materials. The patterning method has a major drawback in achieving high pixel density due to the intrinsic shadowing effect caused by the thickness of the current shadow mask technology: the fine-metal shadow mask (FMM) where the minimal thickness of the mask is over 10 μm. With the FMM, it is difficult to produce RGB subpixels with a dimension less than 20 μm and a pixel density of more than 1000 ppi.

As an alternative to FMM, a silicon nitride-based shadow mask was produced and disclosed in U.S. Pat. No. 9,142,779 for patterning OLED displays. This shadow mask comprises a solid silicon frame and a perforated, free-standing silicon nitride membrane measuring one micron thick. Owing to the much-reduced mask thickness compared to FMM, the pixel density achievable by this silicon nitride shadow mask is greatly increased to more than 2000 ppi, which is sufficient for VR/AR applications. However, the disclosed technology has serious limitations. The free-standing silicon nitride membrane relies on its intrinsic tensile stress to maintain its flatness with respect to the supporting silicon frame. However, this same tensile stress also induces a force pulling the silicon frame inward to cause a curvature in the membrane. As a result, there is an unwanted gap between the mask and the substrate, leading to registration and alignment errors between the two and significant offsets and non-uniformity in the deposition patterns. This problem scales with the size of the shadow mask. Consequently, the techniques described in U.S. Pat. No. 9,142,779 is generally applicable to shadow masks with a silicon nitride membrane of less than one inch in the diagonal dimension.

SUMMARY OF THE INVENTION

A shadow mask for patterned vapor deposition of an organic light-emitting diode (OLED) material includes a ceramic membrane under tensile stress having a thickness of approximately less than 5 microns. In one embodiment, the thickness can range from 0.2 microns to 5 microns. In another embodiment, the thickness can range from 0.5 microns to 2 microns. The ceramic membrane includes a central membrane region with a plurality of through-apertures forming an aperture array through which a vaporized deposition material can pass. In one embodiment, each aperture may include at least one aperture dimension being less than approximately 10 microns. In another embodiment, a total area of apertures in the central membrane region is approximately 10 percent to approximately 50 percent of a total central membrane area. A peripheral membrane region surrounds the central membrane region. A multilayer peripheral support is attached to a rear surface of the peripheral membrane region, with a hollow portion beneath the central membrane region. The multilayer peripheral support has a base layer, and an interlayer under compressive stress positioned above the base layer and attached to a lower surface of the peripheral membrane region. The compressive stress of the interlayer is selected to balance a tensile stress of the ceramic membrane such that the ceramic membrane is maintained in a planar condition.

In another aspect, the present invention provides a shadow mask module in which masks as described above are inserted into a rigid carrier having a shadow mask supporting windows. Each window has an open portion and a window frame surrounding the open portion. The window frame is sized to accommodate the shadow masks such that the central membrane region is positioned in the window open portion and the peripheral membrane region with the multilayer peripheral support attached to the rear surface contacts the window frame surrounding the open portion.

In another aspect, the present invention provides a method for making a shadow mask module. The method includes providing a rigid carrier having a shadow mask supporting windows. Each window has an open portion and a window frame surrounding the open portion, the window frame sized to accommodate a shadow mask. A shadow mask blank is positioned in each of the rigid carrier windows, and each shadow mask blank is bonded to each window frame. Each of the shadow mask blanks includes a ceramic membrane upper layer and a base layer.

A shadow mask pattern of perforations is etched in each of the ceramic membrane upper layers to define a central patterned membrane region and an unpatterned peripheral membrane region. The base layer is removed in a region beneath the central membrane region such that a shadow mask is formed with an unsupported patterned central membrane region and a supported unpatterned peripheral membrane region.

Advantageously, the shadow masks of the present invention exhibit improved flatness, which is important for achieving micron-scale patterning.

Another advantageous feature of the invention is that the disclosed shadow mask with a free-standing membrane can be scaled to large dimensions, for example a rectangle of a 2-inch diagonal or larger, using conventional microfabrication methods. Further, the manufacturing processes of the present invention are robust, and the yield is high even for the fabrication of large-area shadow masks.

Still another advantage of the invention is that the shadow mask module made by the disclosed method comprises accurately aligned shadow masks for large-area patterning and can improve individual shadow masks' mechanical strength and flatness.

BRIEF DESCRIPTION OF THE DRAWINGS

FIG. 2a is a top view of the mask; FIG. 2b is a cross section of the mask taken along line A-A' of FIG. 2a; FIG. 2c is a cross-section of the mask taken along line B-B' of FIG. 2a; FIG. 2d is a cross-section of the mask taken along line C-C' of FIG. 2a.

FIG. 11b is a top view of a shadow mask on a rigid carrier; the dashed line between A and A' indicates the location of the cross-section in FIG. 11a.

In FIG. 16a, the peripheral support includes cavities and the rigid carrier includes pillars; In FIG. 16b the peripheral support includes pillars and the rigid carrier includes cavities.

FIG. 18a has recessed areas under the peripheral support; FIG. 18b has a shadow mask module with a rigid carrier that has hollowed areas under the peripheral support.

DETAILED DESCRIPTION

Figure 1:
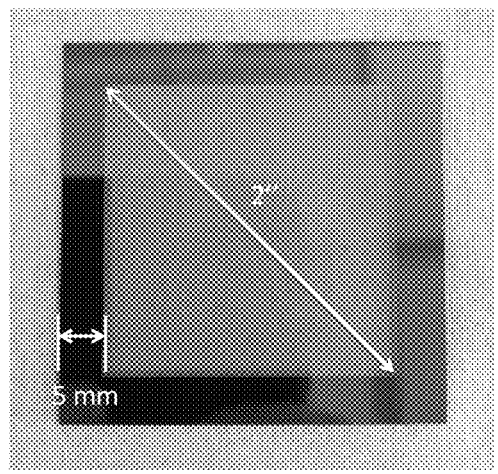
FIG. 1 depicts a photograph of a shadow mask according to the present invention with a square free-standing membrane area of 2-inch diagonal, a frame width of 5 mm, and an aperture density of 2000 apertures per square inch.

The present invention describes a shadow mask for the patterning of vapor-deposited thin films, a shadow mask module that includes an array of shadow masks, and methods of making the masks and the array. In an embodiment, the thin films to be patterned are used in OLED devices. Turning to the drawings in detail, FIGS. 2a-2d depict a shadow mask according to an embodiment of the present invention.

In one aspect, the present invention provides a shadow mask 200 having a ceramic membrane 210 a central membrane region 211 with a plurality of through-apertures 212 forming an aperture array through which a vaporized deposition material can pass. In one embodiment, the membrane includes a material with a Young's modulus higher than 50 GPa. In another embodiment, the membrane includes a material with a Young's modulus higher than 100 GPa. In still another embodiment, the membrane includes a material with a Young's modulus higher than 200 GPa. In one aspect, the ceramic membrane may be a silicon nitride, silicon oxide, or silicon oxynitride thin layer having a thickness less than 5 microns and is under tensile stress. In some embodiments, the ceramic membrane may be a composite comprising ceramic components, such as silicon nitride, silicon oxide, and silicon oxynitride, and non-ceramic components, such as silicon, polymer, metal, carbon nanotube, and graphene. The composite may be a multilayer or mixed layer. Note that the term "ceramic membrane" as used herein and in the claims, includes both these ceramic membranes (e.g., silicon nitride, silicon oxide, or silicon oxynitride) and these composites that include ceramic and non-ceramic components. In some embodiments, the thickness of the ceramic membrane 210 is selected to be approximately 0.2 micron to 5 microns. In some embodiments, the thickness of the ceramic membrane is of approximately 0.5 micron to 2 microns.

The level of tensile stress may be optionally tuned based on the selected composition of the silicon nitride (non-stoichiometric compositions), optional dopants and dopant concentrations, and fabrication techniques for the ceramic layer. In some embodiments, each aperture 212 may include at least one aperture dimension that less than approximately 10 microns such that small pixel sizes may be created using the shadow masks of the present invention. In some embodiments, a total area of apertures in the central membrane region 211 may be approximately 10 percent to approximately 50 percent of a total central membrane region area.

Figure 2A:
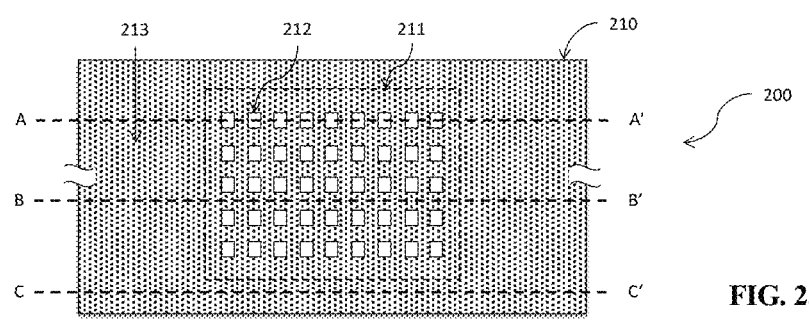
FIGS. 2a-2d schematically depict a shadow mask according to an embodiment.
Figure 2B:
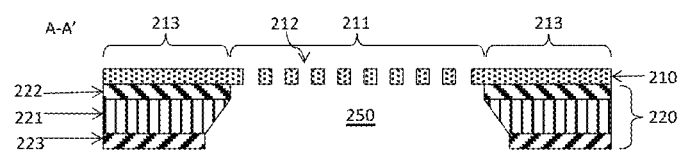
Figure 2C:
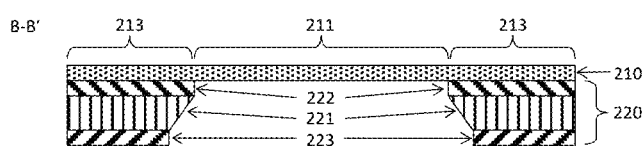
Figure 2D:

Surrounding the central membrane region 211 is a peripheral membrane region 213 that does not include through-apertures. A multilayer peripheral support 220 is attached to a rear surface of the peripheral membrane region 213, as seen in FIG. 2B. As seen in FIGS. 2B and 2C, the central membrane region 211 is free-standing/unsupported by the peripheral support 220 with a hollow portion 250 beneath the central membrane region 211. The multilayer peripheral support 220 includes at least a base layer 221 and an interlayer 222 under compressive stress positioned above the base layer and attached to a lower surface of the peripheral membrane region. In the embodiment of FIG. 2, the compressive stress of the interlayer is selected to balance a tensile stress of the ceramic membrane such that the ceramic membrane is maintained in a planar condition. As will be discussed in further detail below, the compressive stress of the interlayer may be tuned through selection of composition, including optional dopant materials, as well as deposition/fabrication techniques for the interlayer. In one embodiment, the base layer 221 may be silicon and the interlayer 221 may be one or more of silicon oxide, silicon nitride, silicon oxynitride, aluminum oxide, aluminum nitride, amorphous silicon, polycrystalline silicon, nickel, iron, nickel-iron alloy, or polymer.

Optionally, at least one lower layer 223 is positioned beneath the base layer 221. The stress level of the lower layer 223 may also be selected to balance the forces of the other layers, including the ceramic membrane 210, interlayer 222 and base layer 221. As such, the lower layer 223 may be selected to have compressive or tensile stress, as required. In one aspect of the invention, lower layer 223 is selected from one or more of silicon oxide, silicon nitride, silicon oxynitride, aluminum oxide, aluminum nitride, amorphous silicon, polycrystalline silicon, nickel, iron, nickel-iron alloy, or polymer and has a composition and fabrication technique selected such that the layer is in tensile stress. Depending upon the overall stress levels of the ceramic membrane and the interlayer 221, layer 223 may be omitted. When layer 223 is omitted, base layer 221 is the lowest layer of the peripheral support 220.

To maintain a high degree of flatness, the membrane 210 is under tensile stress. However, the tensile stress of the membrane 210 will also produce a force to bend the entire mask and thus result in an undesirable curvature in the shadow mask. This curvature will increase the gap between the shadow mask and the substrate, which is to be patterned with materials, causing significant offsets in the deposition patterns. In one embodiment, to balance the force incurred by the tensile stress of the membrane 210, the interlayer 222, which is on the same side of the base layer 221 as the membrane 210, is under compressive stress, and the lower layer 223, which is on the opposite side of the substrate 221, is under tensile stress. Both the interlayer 222 and the lower layer 223 will produce a force to counteract the force produced by the tensile stress of the membrane 210. In this way, the flatness of the shadow mask is improved, and the free-standing region 211 of the membrane 210 with perforated apertures may be maintained in closer contact with the substrate to be patterned with the vapor deposited materials.

The composition and dimensions of each component of the present shadow mask are described in the following: Membrane 210: The membrane 210 is under tensile stress and includes at least one of silicon nitride, silicon oxynitride with the atomic ratio of oxygen less than 30%, and aluminum oxide. In an embodiment, the membrane 210 is silicon nitride. The thickness of the membrane 210 is less than 5 μm. In a preferred embodiment, the thickness of the membrane 210 is less than 5 μm, but more than 0.2 μm. In a further preferred embodiment, the thickness of the membrane 210 is less than 2 μm, but more than 0.5 μm. The membrane 210 covers the top of the peripheral support 220. In an embodiment, the membrane 210 covers part of the top surface of the peripheral support 220. In another embodiment, the membrane 210 covers the entire top surface of the peripheral support 220. In still another embodiment, the membrane 210 covers the entire top surface and all the side surfaces of the peripheral support 220.

Apertures 212 in the membrane 210: The membrane 210 contains apertures 212. In an embodiment, the apertures 212 are in the free-standing region 211 of the membrane 210, allowing material vapor to pass through. In another embodiment, the apertures 212 may be in both the supported region 213 and the free-standing region 211 of the membrane 210. The apertures 212 in the supported region 213 can further reduce the force exerted on the mask by the membrane 210. The apertures 212 in the membrane 210 can take any shape. In one embodiment, the apertures 212 are circular or elliptical. In another embodiment, the apertures 212 are rectangular or rounded-corner rectangular. In still another embodiment, the apertures 212 are polygonal. The aperture array can take any particular pattern. In an embodiment, the apertures 212 are arranged in rectangular lattice. In another embodiment, the apertures 212 are arranged in square lattice. In still another embodiment, the apertures 212 are arranged in hexagonal lattice. One or more apertures 212 in the free-standing region 211 of the membrane 210 have at least one dimension smaller than 10 μm. In one embodiment, one or more apertures 212 in the free-standing region 211 of the membrane 210 have every dimension smaller than 10 μm. In another embodiment, one or more apertures 212 in the free-standing region 211 of the membrane 210 have at least one dimension smaller than 5 μm. In still another embodiment, one or more apertures 212 in the free-standing region 211 of the membrane 210 have every dimension smaller than 5 μm. These apertures 212 occupy a certain percentage of the total area of the free-standing membrane. In an embodiment, the percentage is larger than 10%. In another embodiment, the percentage is between 10% and 50% of the total area.

Base layer 221 of the peripheral support 220: The base layer 221 in the disclosed shadow mask includes at least one of silicon, polycrystalline silicon, quartz, and glass. In an embodiment, the base layer 221 is silicon. The base layer 221 can take any shape. In one embodiment, the base layer 221 takes the shape of standard silicon wafers used in semiconductor manufacturing. The hollow region 250 of the shadow mask defines the boundaries of the free-standing region 211 of the membrane 210 and can take any shape. In an embodiment, the hollow region 250 is rectangular. In another embodiment, the hollow region 250 is square. The size of the hollow region determines the size of the area that can be patterned each time using the present shadow mask. In an embodiment, the hollow region 250 has at least one dimension larger than 1 inch. In another embodiment, the hollow region 250 has at least one dimension larger than 2 inches. In still another embodiment, the hollow region 250 has at least one dimension larger than 5 inches.

Interlayer 222 of the peripheral support 220: The interlayer 222 is located between the supported peripheral region 213 of the membrane 210 and the solid region of the base layer 221 and is under compressive stress to produce a force to counteract the tensile stress of the membrane 210 to maintain the overall mask in a flat condition. There can be more than one interlayer 222 between the membrane 210 and the base layer 221. The interlayer 222 comprises at least one of silicon oxide, silicon oxynitride with the atomic ratio of oxygen larger than 30%, oxide of different elements, amorphous silicon, polycrystalline silicon, metal like nickel, iron, or nickel-iron alloy, and polymer like parylene, polyimide or PMMA. In an embodiment, the interlayer 222 comprises silicon oxide. The thickness of the interlayer 222 determines the force that counteracts the force incurred by the tensile stress of the membrane 210. The force increases as the thickness of the interlayer 222 increases. In an embodiment, the thickness of the interlayer 222 is less than 5 µm. In another embodiment, the thickness of the interlayer 222 is less than 2 µm. In still another embodiment, the thickness of the interlayer 222 is less than 1 µm. In still another embodiment, the thickness of the interlayer 222 is less than 0.5 µm. Other factors that can selectively tune the stress of interlayer 222 are optional dopants, optional compositional changes (e.g., off-stoichiometric compositions), fabrication techniques (e.g., substrate bias during high-energy deposition processes such as sputtering or plasma-enhanced CVD, etc.). It is noted that when the compositions are recited in the specification and claims, it is understood that these nominal compositions include off-stoichiometric compositions and also included doped compositions, even when not explicitly recited.

Lower layer 223 of the peripheral support 220: The lower layer 223 is located on the opposite side of the base layer 221 with respect to the membrane 210. In one embodiment, lower layer 223 is under tensile stress to produce a force that bends the mask towards the side with the outer layer 223, to maintain the overall structure of the mask in a planar, flat condition. There can be more than one lower layer 223. The lower layer 223 includes at least one of silicon nitride, silicon oxynitride with the atomic ratio of oxygen less than 30%, oxides of different elements such as aluminum oxide, metals such as nickel, iron, or nickel-iron alloys, and polymers such as parylene, polyimide or PMMA. In an embodiment, the lower layer 223 is silicon nitride. The thickness and composition of the lower layer 223 determines the force that counteracts the force incurred by the tensile stress of the membrane 210. The force increases as the thickness of the lower layer 223 increases. In an embodiment, the thickness of the lower layer 223 is less than 5 In another embodiment, the thickness of the lower layer 223 is less than 2 In still another embodiment, the thickness of the lower layer 223 is less than 1 In still another embodiment, the thickness of the lower layer 223 is less than 0.5 Other factors that can selectively tune the stress of lower layer 223 are optional dopants, optional compositional changes (e.g., off-stoichiometric compositions), fabrication techniques (e.g., substrate bias during high-energy deposition processes such as sputtering or plasma-enhanced CVD, etc.). It is noted that when the compositions are recited in the specification and claims, it is understood that these nominal compositions include off-stoichiometric compositions and also included doped compositions, even when not explicitly recited.

In another aspect, the present disclosure provides a method to make the disclosed shadow mask. The general fabrication process flow of this method is illustrated in FIGS. 3a-3h and is described in the following steps. Note that the steps below are for illustration only and in some aspects may be performed in a different order or multiple steps may be performed simultaneously.

Figure 3A:
FIGS. 3a-3h depict the fabrication process of the shadow mask of FIGS. 2a-2d.
Figure 3B:
Figure 3C:
Figure 3D:
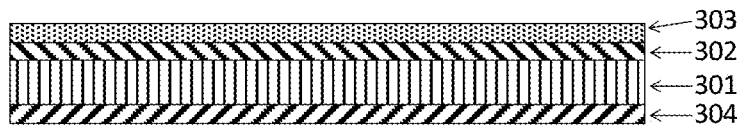

The fabrication starts with a clean, pristine substrate 301 acting as a base layer (FIG. 3a), such as a double side polished silicon wafer. A pristine interlayer 302 is deposited on top of the substrate/base layer 301 (FIG. 3b). In an embodiment, the interlayer 302 comprises silicon oxide and is deposited by a thermal oxidation process. In another embodiment, the interlayer 302 is silicon oxide and is deposited by plasma-enhanced chemical vapor deposition (PECVD). A pristine membrane layer 303 is then deposited on the interlayer 302 (FIG. 3c). In an embodiment, the membrane 303 comprises silicon nitride and is deposited by chemical vapor deposition (CVD). In another embodiment, the membrane 303 comprises low-stress silicon nitride and is deposited by low-pressure chemical vapor deposition (LPCVD). Other techniques such as plasma-enhanced CVD may be selected depending upon the desired level of stress in the membrane layer, which may be tuned through deposition techniques and composition selections. A pristine lower layer 304 is further deposited on the opposite side of the substrate/base layer 301 with respect to the membrane layer 303 (FIG. 3d). In an embodiment, the lower layer 304 is formed at the same time as the membrane layer 303 and is of the same material composition as the membrane layer 303. In another embodiment, the lower layer 304 is formed after the deposition of the membrane layer 303 and is of different material composition of the membrane layer 303. In still another embodiment, the lower layer 304 is formed before the deposition of the membrane layer 303 and is of different material composition of the membrane layer 303.

Figure 3E:
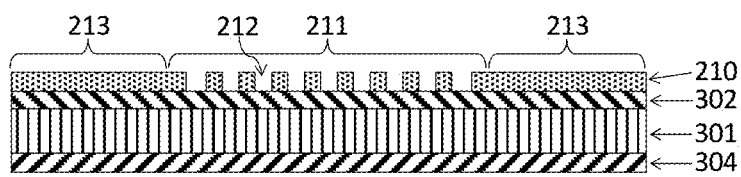
Figure 3F:
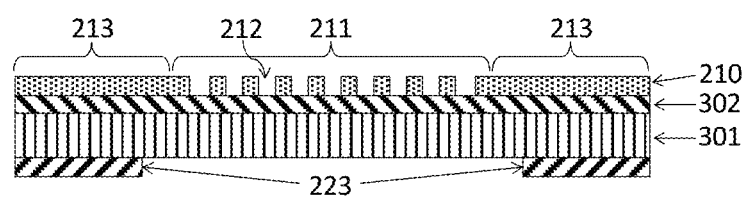
Figure 3G:
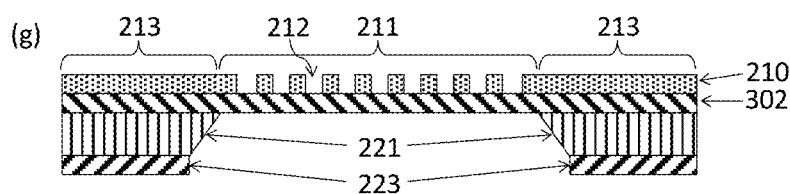
Figure 3H:
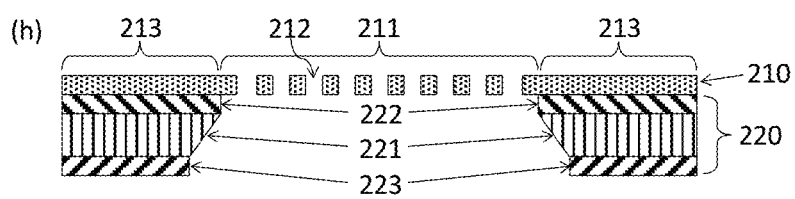

Apertures 212 are then patterned and perforated on the pristine membrane layer 303 via photolithography and etching to produce perforated membrane 210 (FIG. 3e). In one embodiment, the apertures 212 are perforated by reactive ion etching (RIE) or deep reactive ion etching (DRIE) with multiple RIE and passivation cycles. In another embodiment, the apertures 212 is perforated by wet etching. Following the aperture perforation step, a certain area of the pristine lower layer 304 is etched away to produce the lower layer 223 on the solid region of the peripheral support 220 (FIG. 3f). The lower layer 304 can be etched by RIE, DRIE or wet etching methods. The substrate/base 301 is then etched through using the remaining lower layer 223 as a hard etching mask, forming 221 in the peripheral support (FIG. 3g). In this step, the interlayer 302 functions as a protecting layer of the perforated membrane 210 from backside etching. The substrate 301 can be etched through by KOH (potassium hydroxide) etch, TMAH (tetramethylammonium hydroxide) etch or DRIE. Finally, the interlayer 302 underneath the free-standing membrane 211 is removed (FIG. 3h), forming the interlayer 222 under the supported membrane 213 and leaving membrane 211 free-standing. The interlayer 302 underneath the free-standing membrane 211 can be removed by BOE (buffered oxide etch) or RIE.

FIG. 1 shows a sample of the present shadow masks with a square free-standing membrane area of 2-inch diagonal, a frame width of 5 mm, and an aperture density of 2000 apertures per inch made by the method described above with respect to FIGS. 3a-3h.

The produced shadow mask can be used as fabricated on the original substrate or further diced out with a desired peripheral support width and peripheral support shape. When used to produce patterned layouts of materials, the disclosed shadow masks can be directly or indirectly connected to a mechanical alignment mechanism. The disclosed shadow masks can also be used as a complete shadow-masking assemblage by mechanically or physically attaching several masks to a fixture or module, such as a metal carrier, to pattern layouts on larger-area substrates, to be described in further detail below. During the shadow mask patterning process, the substrate to be patterned can be placed in proximity to or in contact with the disclosed shadow masks from either side of the membrane.

In an aspect, the disclosed shadow mask can be used to pattern materials evaporated from a single source or co-evaporated from multiple sources. In particular, the improved flatness of the shadow mask can reduce the spacing between the shadow mask and the substrate to be patterned and realize high-quality, micron-scale material patterning with significantly reduced shadowing effect. This is of particular significance in patterning OLED materials, as the reduced shadowing effect will lead to increased pixel density and/or larger pixel aperture ratio. In an embodiment, the disclosed shadow mask is used to pattern materials used in an OLED device. In another embodiment, the disclosed shadow mask is used to pattern materials used in the light-emitting layers of an OLED device.

In an aspect, the present disclosure provides a shadow mask for producing patterned layouts during vapor deposition of thin films and a method for making the same. The structures of the disclosed shadow mask, the components and combinations thereof, and the fabrication methods are described herein. In various embodiments, the shadow mask comprises one or more components described herein, and the method to produce the shadow mask comprises one or more processes described herein.

The following examples are presented to illustrate the present disclosure. They are not intended to be limiting in any manner.

Example 1

In this example, the fabrication procedure of a shadow mask of the disclosed structure following the disclosed method is described.

Figure 4:
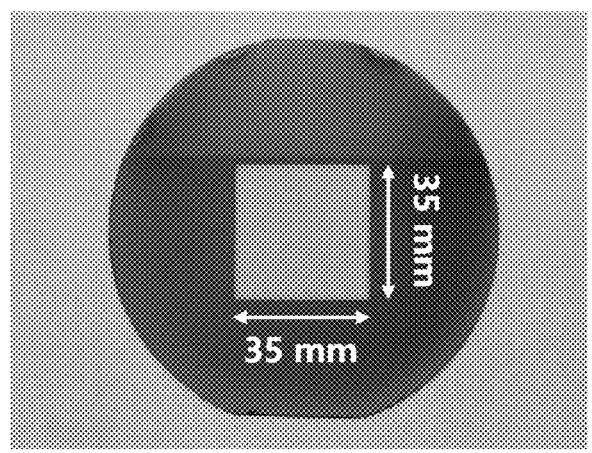
FIG. 4 depicts a photograph of a shadow mask according to an embodiment comprising a 1.5 µm $SiN_x$ membrane with a 35×35 mm² free-standing region and a frame with 3000 Å $SiO_x$ as the interlayer, 400 µm Si as the substrate, and 1.5 µm $SiN_x$ as the outer layer.
Figure 5:
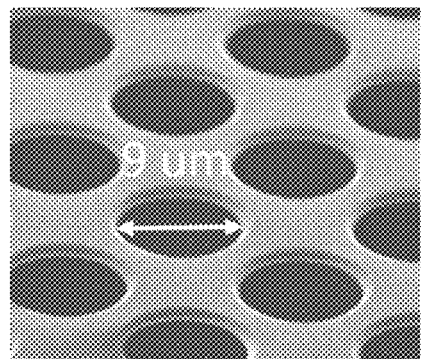
FIG. 5 depicts an enlarged photograph of the perforated apertures in the free-standing region of the $SiN_x$ membrane of the shadow mask of FIG. 4.

A 4-inch double side polished silicon wafer with a thickness of 400 µm was used as the starting substrate to fabricate the shadow mask. After cleaning by DI water and 120° C. sulfuric acid solution ($H_2SO_4/H_2O_2=10/1$) successively, the wafer was dipped into room temperature HF solution for 1 min to remove native oxide. Then the wafer was transferred into a furnace to grow 3000 Å silicon oxide ($SiO_x$) at 1000° C. on both sides of the wafer. The $SiO_x$ on one side of the wafer was removed by oxide etchant. The other side of the wafer still with $SiO_x$ on it is defined as the front side and the side without $SiO_x$ as the backside. Next, 1.5 µm silicon nitride ($SiN_x$) was deposited on both sides of the wafer in a LPCVD furnace. Then photoresist was spin-coated on the front side and a pattern that defines the apertures in the membrane was transferred onto the photoresist layer from a photo mask by contact photolithography. The apertures in the $SiN_x$ layer were subsequently perforated by RIE with the patterned photoresist as a hard mask. After removing the photoresist on the front side, the back side of the wafer was coated with photoresist, followed by transferring a pattern, which defines the free-standing area of the membrane, to the backside $SiN_x$ layer using the same photolithography and dry etching processes as the front side. Then the wafer was cleaned by 120° C. sulfuric acid solution before soaking it into 25% TMAH solution to etch through the bulk silicon with the $SiN_x$ on the backside as a hard mask. After the Si underneath the free-standing region of the membrane was completely etched away, the wafer was taken out of the TMAH bath and dipped into oxide etchant to remove the $SiO_x$ under the $SiN_x$ membrane within the free-standing area to finish the fabrication. As shown in FIG. 4 the final shadow mask comprises a 1.5 µm $SiN_x$ membrane with a 35×35 mm² free-standing region and a peripheral support with 3000 Å $SiO_x$ as the interlayer, 400 µm Si as the substrate, and 1.5 µm $SiN_x$ as the lower layer. As shown in FIG. 5, the perforated apertures in the free-standing region of the $SiN_x$ membrane are circular of 9 µm in diameter and arranged in a square lattice with a pitch of 12.7 µm, forming an array that can pattern a pixel array of 2000 PPI.

Example 2

A shadow mask was produced in the same fashion as Example 1 except that the thickness of the $SiO_x$ layer was 5000 Å instead of 3000 Å.

Example 3

A shadow mask was produced in the same fashion as Example 1 except that the thickness of the $SiO_x$ layer was 6000 Å instead of 3000 Å.

Example 4

A shadow mask was produced in the same fashion as Example 1 except that the thickness of the $SiO_x$ layer was 8000 Å instead of 3000 Å.

Example 5

Figure 6:
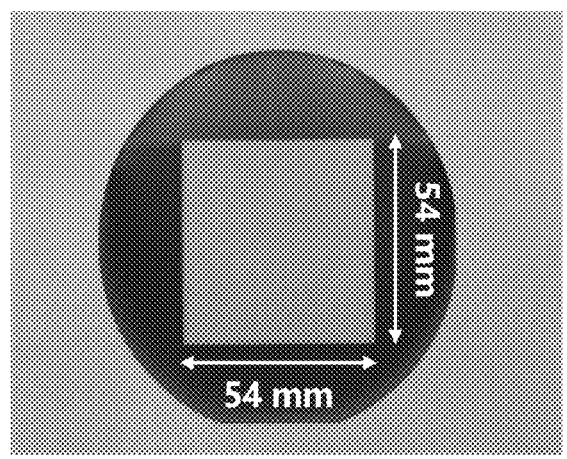
FIG. 6 depicts a photograph of a shadow mask according to an embodiment with a 54×54 mm² free-standing region, which has a diagonal of approximately 3 inches.

A shadow mask was produced in the same fashion as Example 1 except that the size of the free-standing region of the membrane was 54×54 mm² instead of 35×35 mm². FIG. 6 shows a photograph of the 54×54 mm² mask, which has a diagonal of roughly 3 inches.

Comparative Example 1

A shadow mask was produced in a similar fashion as Example 1 except that no $SiO_x$ interlayer was deposited.

The fabrication yield of Example 1-4 is considerably higher than that of the Comparative Example 1, as shown in TABLE 1, demonstrating the robustness of the disclosed structure and method. The $SiO_x$ layer, part of which forms the interlayer in the frame, serves as a temporary protecting layer for the membrane within the free-standing region in the late stage of the Si through-etch step, lowering the chance of membrane breakage and thus increasing the yield.

TABLE 1

|  | Example 1 (3000 Å SiO$_x$) | Example 2 (5000 Å SiO$_x$) | Example 3 (6000 Å SiO$_x$) | Example 4 (8000 Å SiO$_x$) | Comparative Example 1 (No SiO$_x$) |
|---|---|---|---|---|---|
| Fabrication Yield | >90% | >90% | >90% | >90% | 20~40% |

Figure 7:
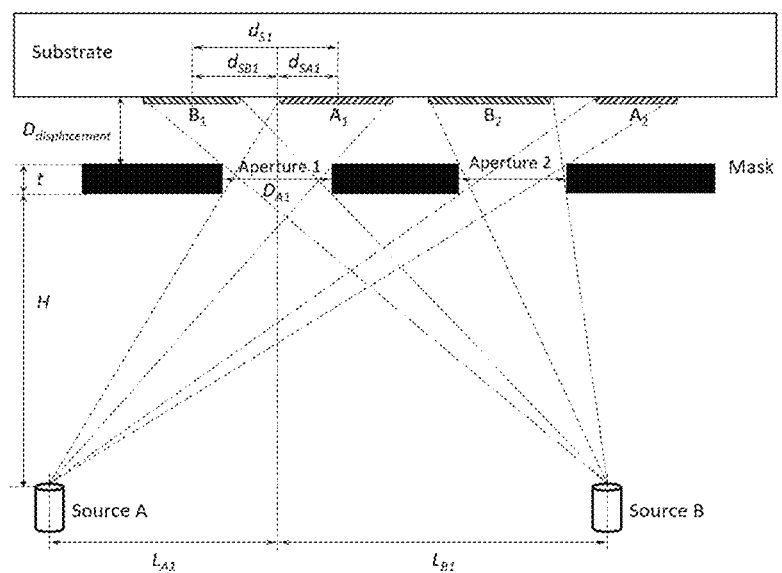
FIG. 7 schematically depicts the geometry of an evaporation system for depositing vaporized material on a substrate using a shadow mask of the present invention.

To showcase the efficacy of the multilayer peripheral support structure in improving the mask flatness, the displacement of the free-standing membrane from a deposition substrate placed directly on the mask was measured. Two OLED materials were co-deposited onto a substrate through the same shadow mask from two evaporation sources apart from each other, as shown in FIG. 7. As a result of the displacement, two offset patterned layouts were produced on the substrate. The displacement can be estimated from the offset using the following equation:

$$D_{displacement} = \frac{2d_{S1}H + D_{A1}t}{2(L_{A1} + L_{B1})} - \frac{t}{2}$$

Where $d_{S1}$, $D_{A1}$, t, H, $L_{A1}$ and $L_{B1}$ are the center separation between the two deposited pixels $A_1$ and $B_1$ from the same aperture, the diameter of aperture 1, the thickness of the mask, the vertical distance between the bottom surface of the mask and the top surface of the organic sources, the lateral distance between aperture 1 center and source A center or source B center, respectively.

Figure 8:
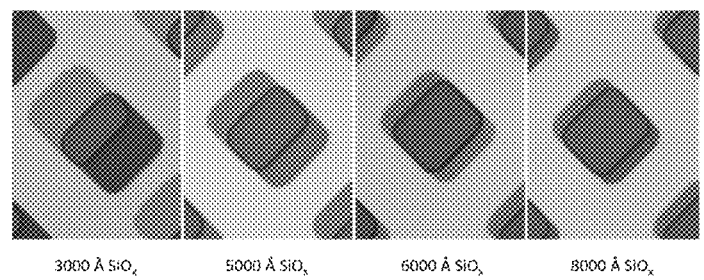
FIG. 8 depicts an offset between two patterned layouts deposited through a series of shadow masks with an interlayer of different thicknesses.
Figure 9:
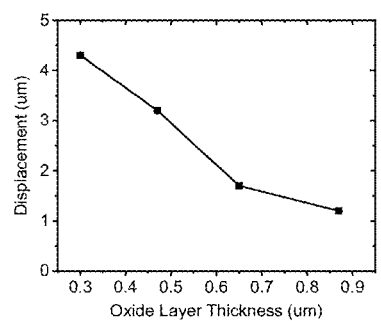
FIG. 9 depicts calculated displacements between a deposition substrate and shadow masks of the present invention using interlayers of different thicknesses.

With the thickness of the oxide layer increasing from 3000 Å to 8000 Å, the offset between the two patterned layouts gradually decreases, as shown in FIG. 8. The corresponding displacements between the deposition substrate and the shadow mask are calculated from the offsets and the deposition geometries and plotted as a function of SiO$_x$ interlayer thickness in FIG. 9. Thick oxide layer with enough compressive force can significantly reduce the displacement to around 1 um, which can ensure micron-scale patterning. These results demonstrate that the multilayer structure in present invention can drastically improve mask flatness.

The aforementioned advantageous features result from the following aspects of the present invention: 1) the multilayer structure of the mask peripheral support can produce a force to counteract the force incurred by the tensile stress of the membrane and improve the mask's flatness; 2) by tuning the composition of the multilayer peripheral support, the dimension of the free-standing membrane can be scaled up to large sizes, such as over 2-inch, without compromising its flatness; 3) a temporary protecting layer for the membrane ensures high yield manufacture.

In another aspect, the present invention provides a method to produce shadow mask modules that comprise a shadow masks, a rigid carrier, and an adhesion layer between the shadow masks and the rigid carrier. The rigid carrier and the adhesion layer mechanically reinforce the shadow masks and maintains flatness of the shadow masks. With multiple shadow masks on a single rigid carrier, the shadow module can be extended to pattern large-area mother glass substrates with multiple OLED panels.

Figure 10:
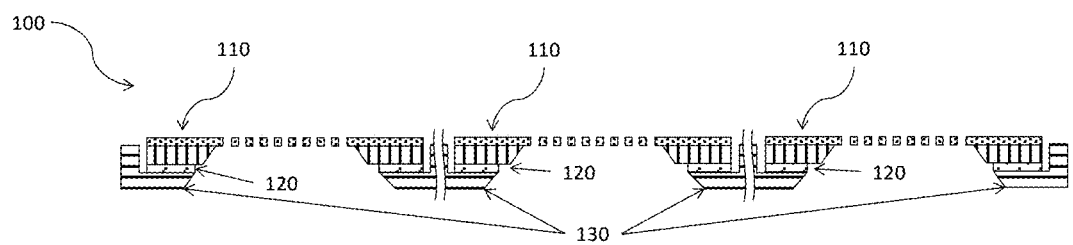
FIG. 10 schematically depicts a cross-sectional view of a shadow mask module with plural shadow masks.

FIG. 10 schematically depicts a cross-section of a shadow mask module 100 having plural shadow masks 110. Multiple shadow masks 110 are bonded to a rigid carrier 130 via an adhesion layer 120. The shadow masks 110 may be substantially similar to the shadow masks of FIGS. 2a-d with modifications in the manufacturing techniques to be discussed in detail below. There are multiple hollow regions in 120 with one under each shadow mask 110. By incorporating multiple shadow masks 110 on a single rigid carrier 130, the shadow mask module can simultaneously pattern multiple OLED display panels on a single mother-glass backplane substrate. The aperture patterns on individual shadow masks should be accurately aligned with each other according to the panel layouts on the backplane substrate.

Figure 11A:
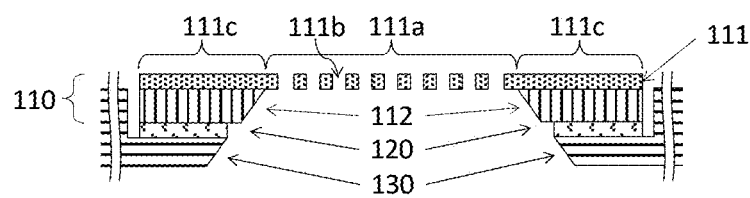
FIG. 11a schematically depicts a cross-sectional view of a shadow mask on a rigid carrier.
Figure 11B:
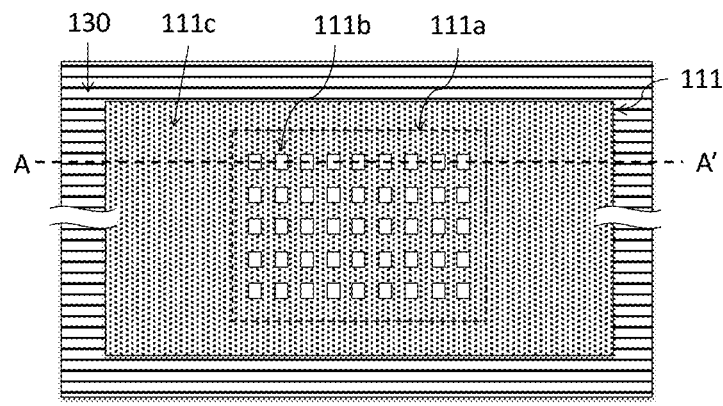

FIGS. 11a-11b depict a cross-sectional and top view of each shadow mask 110 of the shadow mask module. The dashed line between A and A' in FIG. 11b indicates the location of the cross-section. Each shadow mask 110 comprises a peripheral 112 and a silicon nitride membrane 111, which has a supported region 111c located above the peripheral support 112 and a free-standing region 111a with a plurality of perforated apertures 111b inside the peripheral support 112. Peripheral support 112 may have tapered edges along the boundary of the free-standing central membrane region 111a. The rigid carrier 130 beneath the shadow mask 110 has a shadow mask supporting region including a hollow region under the free-standing membrane 111a. The edge of the hollow region of 130 is tapered to increase the clearance for shadow mask 110 and to avoid blocking vapor during thin film depositions. Rigid carrier window frame portion 130 is recessed to accommodate shadow mask 110. In an embodiment, the topmost surface of shadow mask 110 should be higher than that of rigid carrier 130 to ensure shadow mask 110 can be maintained in close proximity to the deposition substrate. The adhesion layer 120 may cover all or only part of the bottom surface of the peripheral support 112. The adhesion layer 120 may also be a discontinuous layer between peripheral support 112 and rigid carrier 130. Together, adhesion layer 120 and rigid carrier 130 provide mechanical support and reinforcement to the fragile shadow mask 110, in particular its peripheral support 112, and effectively maintains the flatness of shadow 110 through adhesion to peripheral support 112.

Figure 12A:
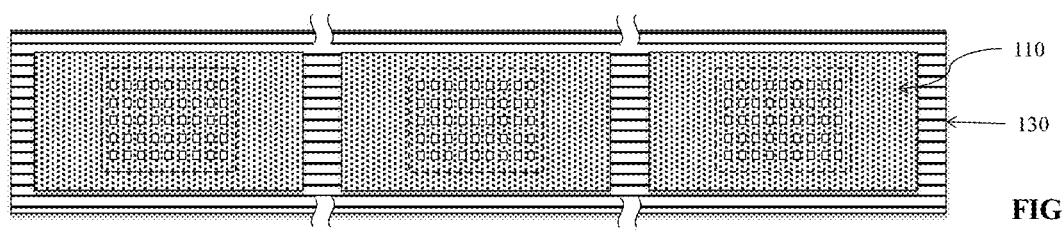
FIG. 12a is a top view of a shadow mask module with plural masks arranged in a row and FIG. 12b is a top view of a shadow mask module with plural masks arranged in a matrix.
Figure 12B:
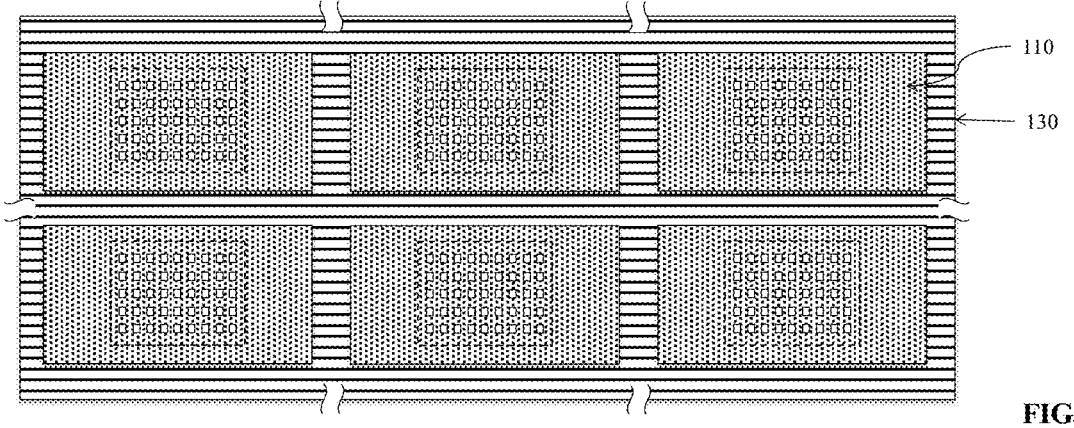

In an embodiment, multiple shadow masks 110 are arranged in a single row on a rigid carrier 130 that is elongated in one direction, as shown in FIG. 12a. In another embodiment, multiple shadow masks 110 are arranged in a matrix on a carrier 130 that extends in both the vertical and horizontal directions, as shown in FIG. 12b. The number of shadow masks on a shadow mask module and the outer dimensions of the module can be extended to meet the requirement of patterning large-scale backplane substrates, such as a G6.5 glass substrate.

Figure 13:
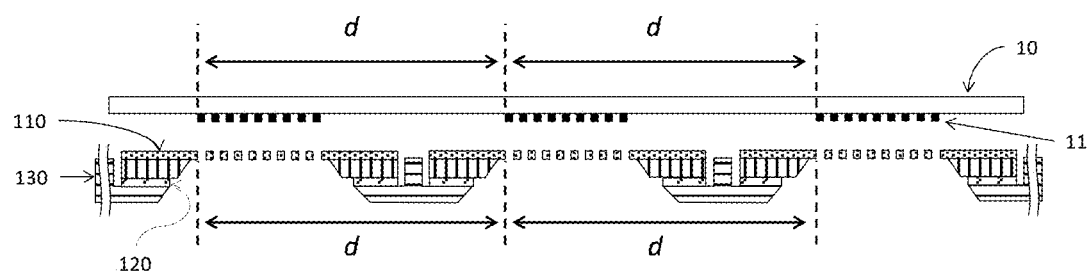
FIG. 13 depicts the spacing between the panel layouts on a backplane substrate and the spacing between the aperture arrays in the shadow masks on the rigid carrier.

Although it is theoretically possible to create shadow mask modules by bonding the shadow masks of FIGS. 2a-d with pre-fabricated perforated apertures to the rigid carrier via the adhesion layer, such a method would require precision bonding for each individual shadow mask to achieve the alignment of the aperture patterns on individual membranes with respect to the panel layouts on the backplane substrate. For example, as seen in FIG. 13 (FIG. 4), when the panel layouts on the mother-glass backplane substrate 10 have an equal spacing d between adjacent pixel arrays 11, the spacing between aperture patterns of adjacent shadow masks should also be equal to d. Since the position of the aperture pattern on each shadow mask is fixed after the apertures are patterned and perforated, the relative position of each shadow mask needs to be accurately controlled throughout the bonding procedure.

As the shadow masks can accommodate pixel densities of more than 2000 ppi, a lateral alignment accuracy of ~1-micron or less is required for the bonding of the shadow mask onto the rigid carrier. Mechanical alignment of a plurality of multi-inch shadow masks with a foot-scale rigid carrier at such precision poses a daunting challenge to the design of bonding equipment and processes. To further complicate the matter, variations in the application process of the adhesion layer and thermal expansion mismatch in the curing process of the adhesion layer may cause unexpected and, very possibly, uneven lateral displacement of shadow masks on the rigid carrier during bonding. Consequently, such displacement will cause misaligned material patterns on the backplane substrate.

To solve this problem, the present invention uses a method to make the shadow module with accurately aligned shadow masks without the need for high-precision bonding. In the inventive method individual shadow mask blanks without perforated apertures are bonded to the rigid carrier followed by forming apertures in the central membrane region of the shadow masks following bonding. The merit of the disclosed method lies in the fact that that individual aperture patterns of different shadow masks on a single carrier are patterned and opened in the same photolithography process and are therefore necessarily aligned with each other. In other words, the accuracy of the lateral alignment between each aperture array in the shadow mask module is determined by photolithography, not bonding.

Figure 14A:
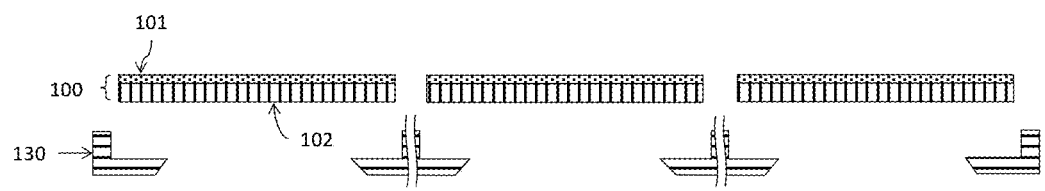
FIG. 14a-d is a process flow of the disclosed method of making shadow mask modules.

The fabrication process flow of this method is described in the following steps and illustrated in FIG. 14. In FIG. 14a, a rigid carrier 130 is provided with plural frames having plural hollow regions. Plural shadow mask module blanks 100 are also provided. Each shadow mask blank includes all of the layers needed to make a shadow mask without patterning or apertures. For example, a ceramic membrane 101 and base layer 102 which may be a silicon nitride membrane and silicon base layer without any patterning or apertures.

Figure 14B:
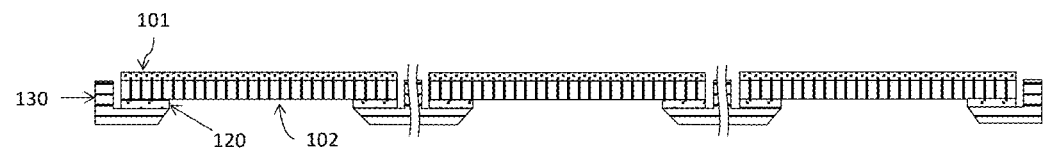

The shadow mask blank 100 is adhered to the rigid carrier through either the application of an adhesive or through a direct bonding process. In FIG. 14b, an adhesion layer 120 is applied to rigid carrier 130 or to the bottom surface of layer 102. The application of adhesion layer 120 may be done by dispensing from a syringe, screen printing, inject printing, spray coating, or evaporation. Shadow mask blank 100 may be adhered to rigid carrier 130 via adhesion layer 120 with each shadow mask 100 positioned over the hollow frame region of rigid carrier 130, followed by curing adhesion layer 120. Curing may be performed by heating, UV irradiation, or both. Pressure may be applied to shadow mask blank 100, rigid carrier 130, or both during curing to ensure that shadow mask blank 100 remains flat and is in close contact with rigid carrier 130. When rigid carrier 130 is glass, anodic bonding may be used to form adhesion layer 120. Heat, pressure, and voltage are applied to shadow mask blank 102 and rigid carrier 130 during the anodic bonding process.

Figure 14C:
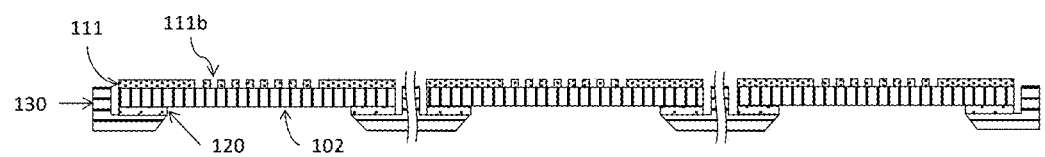

In FIG. 14c, patterning and opening apertures 111b with specified patterns in all of the ceramic membranes 101 on rigid carrier 130 is performed. The perforation of ceramic membrane 101 yields a peripheral membrane region 111 with apertures 111b. The aperture patterns of all the ceramic membranes are defined in the same photolithography process. This process may follow a standard microfabrication procedure, which includes coating, exposure, and development of a photoresist layer that defines the apertures, an etching step to open the apertures, and a step of removing the photoresist layer. The photoresist layer that defines apertures 111b on all ceramic membranes 101 is exposed through a photomask at once by a contact aligner or exposed stepwise by a stepper or a line scanner. The perforation to form apertures 111b on all ceramic membranes 101 is performed in the same etching process.

Figure 14D:
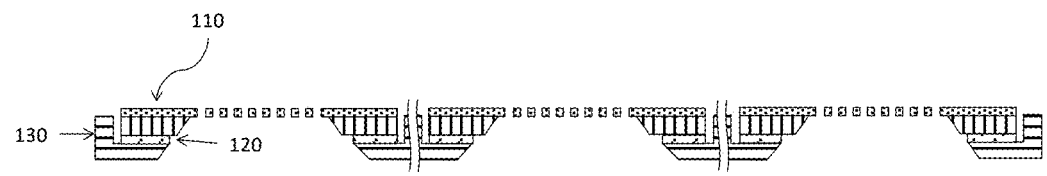

In FIG. 14d, a hollow region is opened in all the bases/supports by etching through layer 102, wherein the remaining portion of layer 102 forms the peripheral support 112 with a hollow region, and the ceramic membrane central region with apertures 111b over the hollow region becomes free-standing.

Note that, although the base 102 of the shadow mask blank is shown as a single layer, 102 may be a multilayer structure. Base layer 102 is etched through by a KOH (potassium hydroxide) etch, a TMAH (tetramethylammonium hydroxide) etch, or RIE. In a multilayer embodiment, base layer 102 may include a layer of silicon nitride, a layer of silicon, and a layer of silicon oxide. In this embodiment, the silicon nitride layer is etched by RIE, the silicon layer is etched by KOH or TMAH, and the silicon oxide layer is etched by a buffered oxide etch (BOE).

Additional post-treatment steps may be added to further enhance the structural integrity of the shadow mask module. In an embodiment, an edge support element 140 is deposited along the backside edge of the free-standing membrane. In another embodiment, the shadow mask module is attached to a second carrier 400 to form a shadow mask assembly.

This method reduces the alignment difficulty during the fabrication of the shadow mask module with aligned shadow masks. The bonding process of the disclosed method happens before the simultaneous formation of perforated apertures on each shadow mask. As a result, any displacement that occurred during bonding does not affect the relative position of the aperture patterns of individual shadow masks with respect to each other. Since the positions of the perforated aperture arrays are defined by the photolithography step, not the bonding step, only a coarse alignment of the shadow mask blanks with the carrier is required during bonding.

The disclosed method increases the scalability of the shadow mask module. The photolithography processes used in the flat panel display industry to manufacture the backplane substrate can be utilized in the disclosed method to form the perforated aperture arrays on the shadow mask module, effectively enabling the fabrication of large-scale shadow mask modules up to Gen10 substrate dimensions. Sharing the same photolithography process with the backplane also means the shadow mask modules made with this method have the same resolution and tolerance as the backplane substrate, which will increase the alignment accuracy of the shadow mask module and the backplane substrate during the shadow masking of deposited organic materials.

The disclosed method produces shadow mask modules with improved mechanical strength over individual shadow masks. The rigid carrier and the adhesion layer together provide mechanical support to the individual shadow masks on the shadow mask module, allowing easy handling and chucking in the shadow masking process. The improved mechanical strength can extend the service life of the shadow masks and reduce mask breakage, leading to cost reduction in OLED display manufacturing.

This method also yields shadow masks with improved flatness on the rigid carrier, compared to shadow masks made without a rigid carrier. The tensile stress of the free-standing silicon nitride membrane, which is necessary to maintain its flatness, can cause unwanted curvature in the peripheral supports of individual shadow masks. Therefore, the shadow mask blanks before the silicon nitride membrane becomes free-standing has less curvature than the shadow mask with a free-standing membrane. After bonding the shadow mask blank to the rigid carrier before the membrane becomes free-standing, the position and shape of the shadow mask are held fast to the rigid carrier by the adhesion layer. Despite the photolithography and etching steps to form the perforated apertures and the free-standing membrane, the shadow mask will not change shape, or flatness, because it is bonded to the rigid carrier.

The details of the disclosed method and the specifications of major components of the shadow mask module associated with the disclosed method, such as their compositions and dimensions, are described below. Issues related to the usefulness of the shadow mask module, such as the flatness of individual shadow masks, the leveling and alignment of shadow masks on the rigid carrier, the fabrication yield, and the robustness of individual shadow masks and the module, will be addressed. For simplicity, drawings of the shadow mask module only show a single shadow mask on the carrier.

Pre-bonding: A rigid carrier 130 and a plurality of shadow mask blanks 100 without a hollow region in the peripheral support and without perforated apertures in the silicon nitride membrane are provided. The rigid carrier 130 provides not only mechanical support to the shadow masks 110 but also a platform for 110 to be held flat by the adhesion layer 120. Rigid carrier 130 has a solid region/frame under each peripheral support region 112 and a hollow region under each free-standing membrane 111a. The edge of the hollow regions may be tapered to increase clearance for incoming vapors during thin film depositions. The region of 130 that is under 112 may be recessed, but the topmost surface of 130 remains lower than the topmost surface of 110. The thickness of the rigid carrier may vary from 500 microns to tens of millimeters, depending on the overall dimensions of the shadow mask module.

The rigid carrier 130 should have high thermal stability and chemical resistance to withstand the thermal or chemical cleaning process and a linear coefficient of thermal expansion (CTE) similar to that of the shadow mask 110 and the adhesion layer 120 to reduce distortion of the shadow mask module during any thermal processes. In an embodiment, 130 has a CTE of less than 20 ppm/K where ppm denotes $10^{-6}$. In another embodiment, rigid carrier 130 has a CTE of less than 10 ppm/K. In still another embodiment, rigid carrier 130 has a CTE of less than 5 ppm/K. Rigid carrier 130 may comprise glass, quartz, sapphire, silicon, silicon nitride, metal, or ceramic. In an embodiment, rigid carrier 130 is glass. In another embodiment, rigid carrier 130 is metal comprising Fe, Ni, or both. In practice, the shadow mask module may be chucked by vacuum or by an electromagnetic force. Preferably, rigid carrier 130 is ferromagnetic and comprises Fe, Ni, an alloy of Fe and Ni, or martensite steel. In an embodiment, rigid carrier 130 is an alloy of 64% Fe and 36% Ni.

Figure 15:
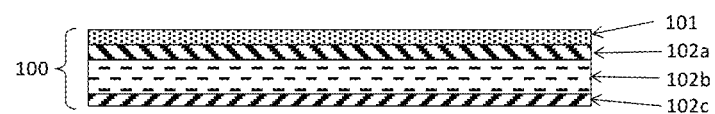
FIG. 15 schematically depicts a multilayer shadow mask blank before bonding.

As seen in FIG. 15, the shadow mask blanks 100 may optionally include a silicon nitride membrane 101 and a support 102. Note that the blank can be just two layers, with the support being silicon. Alternatively, the blank can be multiple layers as shown in FIG. 15. Blank 100 should be prepared to be as flat as possible. The tensile stress of the silicon nitride membrane 101 will result in a tendency to curvature in 102. To balance this tensile stress, support 102 may have a multilayer structure comprising a bulk silicon layer 102b, an interlayer 102a between 101 and 102b, and a lower layer embodiment, rigid 102c underneath 102b, wherein 102a is under compressive stress, and 102c is under tensile stress, as shown in FIG. 15. In an embodiment, 102a may include silicon oxide, and 102c may include silicon nitride. In another embodiment, 102a is absent, and 102c is a layer of silicon nitride of the same thickness as 101. Further, compositional changes in the material layer and optional dopants and processing may be included to fine-tune the stress to ensure that the stresses are properly balanced to ensure optimal mask flatness.

The thickness of membrane 101 varies from 500 nm to 2 microns. The thickness of layers 102 and 102b varies from 100 microns to 800 microns. The thickness of layer 102a varies from 10 nm to 1 micron. The thickness of layer 102c varies from 500 nm to 2 microns. Layers 101, 102a and 102c are deposited prior to bonding by commonly known methods. Layer 101 may be deposited by LPCVD. When layer 102c is silicon nitride, it may also be deposited by LPCVD in the same process as layer 101. When layer 102a is silicon oxide, it may be formed by thermal oxidation.

Bonding:

In the bonding process, an adhesion layer 120 attaches the shadow mask blank 100 to the rigid carrier 130. Adhesion layer 120 needs to provide high binding strength to form a stable bond between 100 and 130, high thermal stability and chemical resistance to withstand the thermal or chemical cleaning process, and a CTE similar to that of 100 and 130 to reduce distortion of the final free-standing silicon nitride membrane 111a in the final shadow mask module. In an embodiment, adhesion layer 120 has a CTE of less than 20 ppm/K. In another embodiment, adhesion layer 120 has a CTE of less than 10 ppm/K. The dimensions of adhesion layer 120, such as its thickness and coverage area, also contribute to the absolute thermal expansion of adhesion layer 120. In an embodiment, adhesion layer 120 has a thickness of fewer than 50 microns. In another embodiment, adhesion layer 120 is a discontinuous layer between support 102 and rigid carrier 130.

Adhesion layer 120 may comprise polymer, glass frit, silicate cement, metal eutectics, or metal solder. In an embodiment, adhesion layer 120 comprises polyimide. In another embodiment, adhesion layer 120 comprises glass frit. Adhesion layer 120 may be cured by UV light, heat, or both to form a stable bond between blank 100 and rigid carrier 130. Pressure may be applied on blank 100 and rigid carrier 130 during curing. Preferably, adhesion layer 120 is cured below 500° C.

Adhesion layer 120 may be a fused layer of glass and silicon when the carrier 130 is glass, and 102 and 130 are bonded by anodic bonding. An electric field is applied between 100 and 130 during anodic bonding in addition to heat and pressure. Adhesion layer 120 may be able to go through a debonding process, in which its adhesion is weakened or lost, so that a bonded blank 100 or shadow mask 110 can be removed from rigid carrier 130. The ability to debond is useful when a shadow mask is broken in fabrication or usage and needs to be replaced. This feature is particularly useful for increasing the production yield of the shadow mask module and extending its service life. The debonding of 120 may occur in one or a combination of the following conditions: above 500° C., in the presence of solvents, in the presence of oxidizing agents, or in the presence of etchants. In an embodiment, a faulty shadow mask is heated to above 500° C. by a laser in an oxygen-rich environment to soften or ablate the adhesion layer 120.

Alignment of Shadow Masks in Bonding

In the bonding process, individual shadow mask blanks 100 only need to be coarsely aligned with the rigid carrier 130, as the position of the free-standing silicon nitride membrane and the perforated aperture array on it are determined in later steps. To facilitate the mechanical alignment of the shadow mask blanks 100 and the rigid carrier 130, the bottom surface of the support 102 and the top surface of the rigid carrier 130 facing support 102 may have interlocking surface structures that mechanically align and interlock each blank 100 with each frame portion of rigid carrier 130.

Figure 16A:
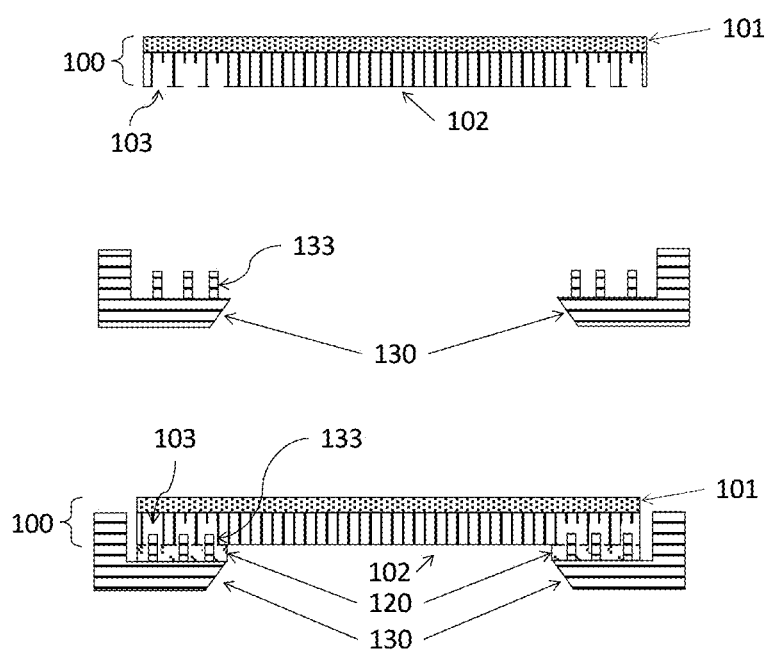
FIG. 16a-b depicts a shadow mask module with the shadow mask and the rigid carrier having interlocking structures.
Figure 16B:
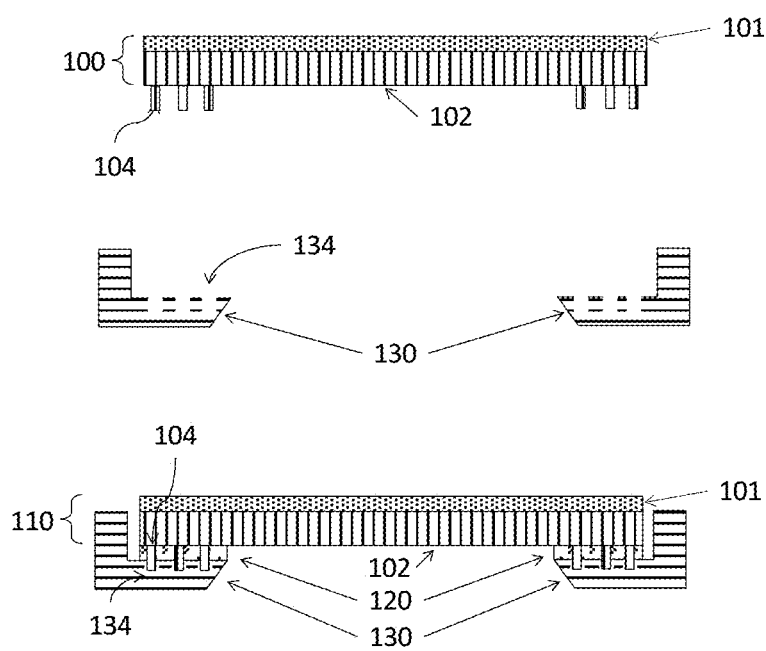

As shown in FIG. 16a, blank support portion 102 has cavities 103 in its bottom surface, and rigid carrier 130 has corresponding pillars 133 on its surface facing blank support 102. When blank 100 is bonded to rigid carrier 130 by adhesion layer 120, pillars 133 fit into cavities 103 thus locking blank 100 in position in the lateral direction. Adhesion layer 120 may fill in the crevices between 103 and 133. The interlocking tolerance between 103 and 133 may vary from tens of microns to hundreds of microns. Likewise, there may be pillars 104 on blank support 102's bottom surface, and corresponding cavities 134 in rigid carrier 130's surface facing blank support 102, as shown in FIG. 16b. Other forms of interlocking structures, such as triangular pillars and cavities, and hemispherical bumps and indentations, may be used. Blank 100 and rigid carrier 130 may have optical alignment marks or fiducial markers to further assist with the mechanical alignment. The interlocking structures also increase the contact area of the adhesion layer with the shadow masks and the rigid carrier, resulting in a stronger bonding between the two elements.

Leveling of Shadow Masks in Bonding

The leveling of shadow masks on the rigid carrier is also important to the usefulness of the entire module. The top surfaces of individual shadow masks on the carrier are leveled to the same plane with micron-scale deviations so that the spacings between individual shadow masks and the backplane substrate are as equal as possible during shadow masking.

The vertical position of each shadow mask on the rigid carrier needs to be accurately controlled for achieving precision leveling of free-standing silicon nitride membranes across all shadow masks. Factors controlling the vertical position of the shadow mask include the thickness and flatness of the shadow mask, the thickness of the adhesion layer, and the flatness of the front surface of the rigid carrier facing the shadow mask.

The thickness of the shadow mask is predetermined by the silicon substrate and the membrane layer grown on it, all of which can be controlled at nanometer accuracy by standard practices in semiconductor manufacturing. The flatness of the shadow mask blank before bonding is controlled by the composition of the support portion of the blank.

Figure 17:
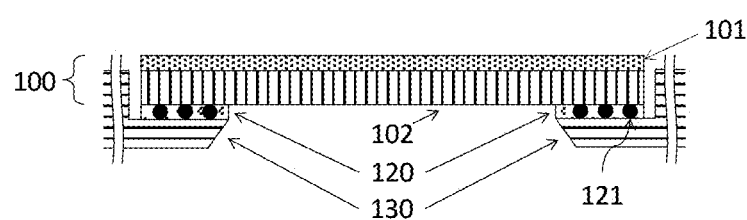
FIG. 17 depicts a shadow mask module that has geometrical spacers in the adhesion layer.

The thickness of the adhesion layer may vary among shadow masks on the same carrier due to the variation in the application procedure of the adhesives, non-uniform pressure, or uneven curing. To regulate the thickness of the adhesion layer, the adhesion layer 120 may comprise geometrical spacers 121, such as microbeads of glass, metal, or polymer, to control the final thickness of 120 after the bonding process, as illustrated in FIG. 17. The spacers 121 partially cover the front surface of rigid carrier 130 that faces blank support portion 102 in a monolayer fashion. The diameter of the spacers determines the final thickness of the adhesion layer 120. Spacers with diameter standard deviation of less than a micron are available commercially. These spacers may be premixed in the adhesives or deposited on the carrier before the application of the adhesion layer. The concentration of these spacers in the adhesion layer is kept low to avoid aggregation. When the adhesion layer is formed by anodic bonding or eutectic bonding, the bonding interfaces are required to be clean and free of particles, and the final thickness of the fused adhesion layer is usually uniform. Spacers are therefore not used in such cases.

Figure 18A:
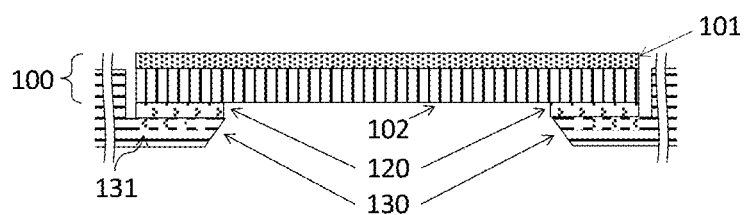
FIGS. 18a-b depict a shadow mask module with a rigid carrier.
Figure 18B:
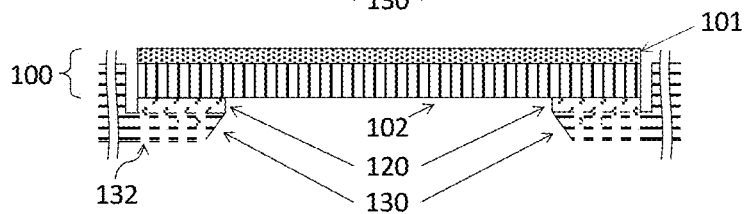

To further regulate the thickness of the adhesion layer 120, the rigid carrier 130 may have recessed or hollowed regions. As illustrated in FIG. 18, the recessed regions 131 and the hollowed regions 132 provide extra space between shadow mask blank 100 and rigid carrier 130 for excessive materials from adhesion layer 120 to fill in and help maintain a uniform thickness for adhesion layer 120. Recessed regions 131 and 132 may be trenches, corrugations, cavities, or through apertures. Adhesion layer 120 may fill part of or all the spaces in recessed regions 131 and 132. When the shadow mask module is treated at elevated temperatures, i.e., during curing or thermal cleaning, recessed regions 131 and 132 may provide redundancy for any thermal expansion of adhesion layer 120. Recessed regions 131 and 132 may also function as service ports or channels in the debonding process. For example, they may allow solvents or etchants to reach adhesion layer 120 or allow mechanical tools to access adhesion layer 120 and blank 100 or shadow mask 110.

Figure 19A:
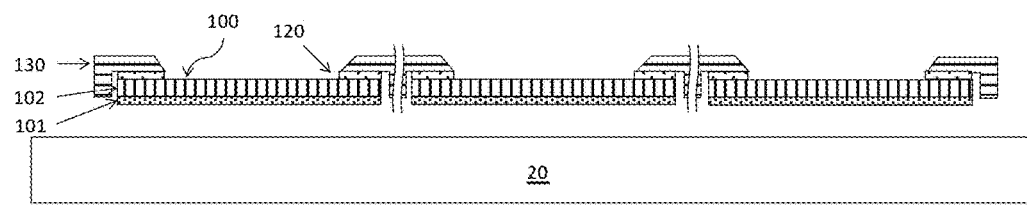
FIG. 19a-b is a process flow of the disclosed method using a flat reference surface to level the shadow masks on the rigid carrier during bonding.
Figure 19B:
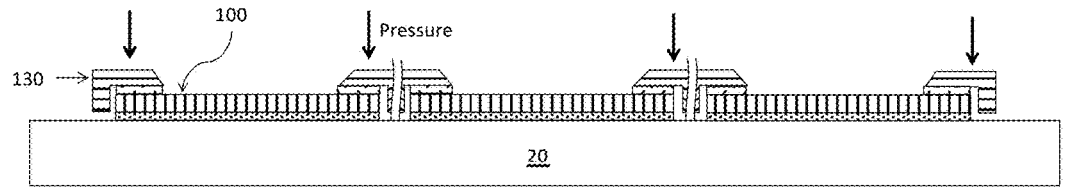

The flatness of the front surface of the rigid carrier is determined by the carrier materials and methods used to form the surface. When the rigid carrier is made of glass, its surface can be established by methods like floating, fusion forming, wet etching. It can be made optically-flat, with flatness deviation down to the nanometer scale. When the rigid carrier is made of metal, its front surface is normally established by machining, mechanical polishing, and electrochemical polishing. Although these methods can produce very smooth surfaces, it is difficult to produce flat and leveled surfaces with micron deviations. To guarantee the leveling of the shadow masks on a metal carrier, a reference surface with a high degree of flatness is introduced in the bonding process to establish a flat plane. As shown in FIG. 19, individual shadow mask blanks 100 are first coarsely aligned and preliminarily attached to rigid carrier 130 via the adhesion layer 120. Before curing adhesion layer 120, the shadow mask module is pressed against a large flat object 20, such as a piece of float glass, with the silicon nitride membrane 101 facing object 20. Adhesion layer 120 is then cured, while pressure is applied to the rigid carrier 130 and the flat object 20 throughout the curing process. Preferably, the flat object 20 is transparent. During the curing process, the leveling of the shadow masks 100 can be monitored by observing the light interference patterns from the other side of object 20, which indicate the spacings between blank 100 and object 20, and the pressure applied on rigid carrier 130 can be adjusted accordingly.

By applying the measures described in this section, the leveling of shadow masks on the rigid carrier can be guaranteed.

Patterning and Perforation of Apertures

The apertures 111b on individual shadow masks are patterned and perforated by photolithography. This process may follow a common microfabrication procedure, which includes coating, exposure, and development of a photoresist layer that defines apertures 111b, an etching step to perforate apertures 111b, and a final step of removing the photoresist layer. The photoresist layer may be deposited by spin coating, spray coating, or slot die coating. The whole photoresist layer is then exposed by a contact aligner through a photomask at once or exposed stepwise by a stepper or a line scanner to form an etching mask, which defines the location of apertures 111b on the silicon nitride membrane 101. Membrane 101 is etched by dry etching methods, such as reactive ion etching (RIE) and deep reactive ion etching (DRIE), or wet etching methods to form apertures 111b. The perforation of apertures 111b on all membranes 101 is done in the same etching process. After etching, the photoresist layer is removed in a photoresist stripper bath or a plasma ashing chamber.

Etching of Shadow Mask Blank Support

Shadow mask support portion 102 is etched through to form the peripheral support 112 with a hollow region, causing the silicon nitride membrane with perforated apertures to become free-standing. Support portion 102 can be etched through by KOH (potassium hydroxide) etch, TMAH (tetramethylammonium hydroxide) etch, or DRIE. The boundary of the free-standing membrane central region 111a is defined by photolithography. In an embodiment, a patterned photoresist layer may be used as an etching mask for support portion 102. In another embodiment, support portion 102 has an interlayer 102a of silicon oxide, a Si layer 102b, and an outer-layer 102c of silicon nitride, wherein 102c may be patterned to form a hard etching mask for 102b, and 102a may function as an etch stop layer and a protection layer for membrane central region 111a during the etching of support layer 102b and is later removed by BOE (buffered oxide etch) or RIE. Additional protection layers, such as photoresist and silicon nitride, may be deposited on the rigid carrier to protect it from the etching of support 102.

After the through etch of support 102, central membrane region 111a becomes free-standing, and the shadow mask module is formed.

Post-Treatment of the Shadow Mask Module

Figure 20:
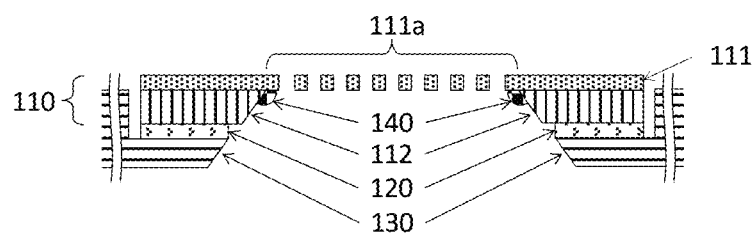
FIG. 20 depicts a shadow mask module with an edge support under the edge of each free-standing shadow mask.

After forming the shadow mask module, the peripheral support 112 in the shadow mask 110 is reinforced by the rigid carrier 130 and the adhesion layer 120. The free-standing silicon nitride membrane central region 111a, however, remains vulnerable. Its free-standing central region 111a is only micron-thin and fragile, susceptible to breakage upon external force during handling or internal stress caused by thermal expansion during heating. Central region 111a is particularly fragile along its edges when it is displaced by external or internal forces from its original plane. To directly reinforce central region 111a, an edge support element 140 is optionally deposited along the boundary between central region 111a and peripheral support 112, as shown in FIG. 20, forming a ring-like structure under central region 111a.

Edge support element 140 may have a lower Young's modulus than membrane 111 and peripheral support 112. It cushions any structural displacement of central region 111a, reducing the chance of breakage. Even when membrane 111 is broken under extreme conditions, edge support 140 may still bind with fragments of membrane 111 and reduce the generation of debris and particles. Edge support 140 should have a linear CTE similar to that of membrane 111 and peripheral support 112. In an embodiment, edge support 140 has a CTE of less than 20 ppm/K. In another embodiment, 140 has a CTE of less than 10 ppm/K. Edge support 140 should also have high thermal stability and chemical resistance to withstand the thermal or chemical cleaning process of the shadow mask module after extended usage. In an embodiment, edge support 140 comprises polyimide, epoxy polymer, silicate cement, or glass frit. Preferably, edge support 140 has low hygroscopicity in ambient and low outgassing under vacuum. In an embodiment, edge support 140 comprises thermal- or UV-cured polyimide.

Figure 21:
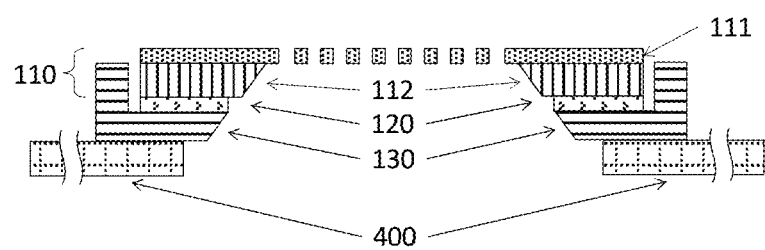
FIG. 21 schematically depicts a cross-section of a shadow mask assembly including shadow mask modules and a second carrier.

The shadow mask module may be further attached to a second carrier 400 to form a shadow mask assembly, as shown in FIG. 21. The shadow mask assembly comprises one or a plurality of the disclosed shadow mask modules. The shadow mask modules are reversibly attached to second carrier 400, and the relative position of each shadow mask module can be independently and repeatedly adjusted. Before using the shadow mask assembly for patterning, the shadow mask modules on second carrier 400 are aligned and fixed in place according to the display panel arrangement on the backplane substrate. The shadow mask modules may be detached from second carrier 400 after patterning and subjected to cleaning procedures. The shadow mask modules may be realigned on 400 each time before patterning. There may be optical alignment marks or fiducial markers on the shadow mask module and second carrier 400 to assist the alignment and fixing of the shadow mask module on 400. Second carrier 400 may comprise metal coils for generating electromagnetic field or mechanical apparatuses for fixing the shadow mask module in place during thin film depositions. In an embodiment, the shadow mask module is attached to second carrier 400 by magnetic force. In another embodiment, the shadow mask module is attached to second carrier 400 by mechanical force.

Figure 22:
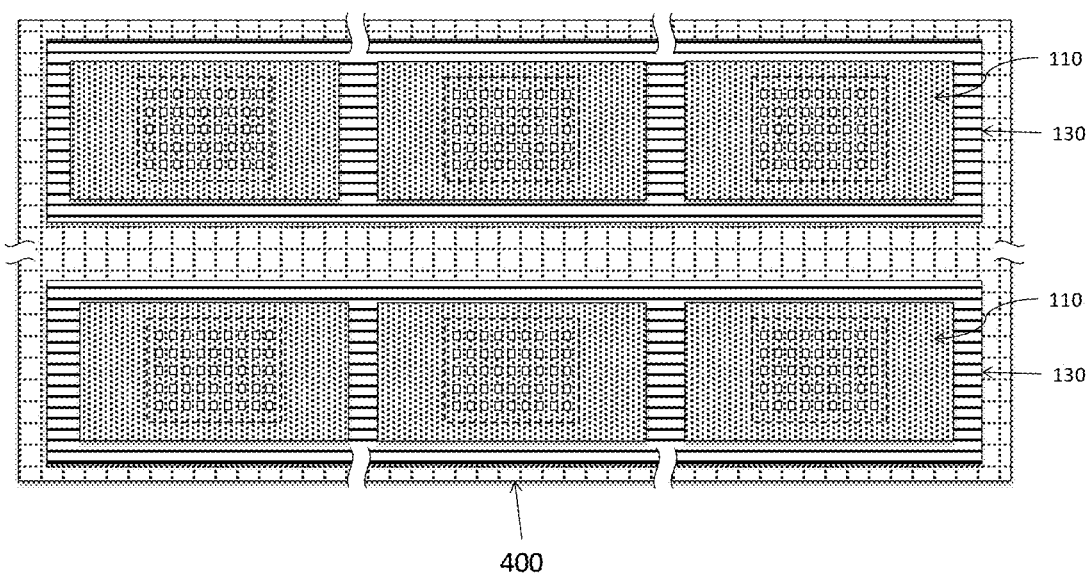
FIG. 22 is a top view of a shadow mask assembly with one or plural shadow mask modules and a second carrier.

The shadow mask assembly may comprise one or a plurality of shadow mask modules with a plurality of shadow masks 110. As shown in FIG. 22, one or a plurality of shadow mask modules comprising multiple shadow masks 110 are attached to second carrier 400.

In an aspect, the present disclosure provides a method to produce shadow mask modules with aligned aperture arrays for producing patterned layouts during the vapor deposition of thin films and methods for making the same. The detailed steps of the method and the structures of the produced shadow mask module thereof are described herein. In various embodiments, the disclosed method to produce the shadow mask module comprises one or more processes described herein, and the shadow mask modules produced by this method comprise one or more components described herein.

Advantages

The prime advantage of the disclosed method is that it produces shadow mask modules with accurately aligned hole arrays without the need to accurately align individual shadow masks with the rigid carrier and with each other during the bonding process.

Another advantage of the disclosed method is that it produces shadow mask modules of large dimensions with the capability of patterning multiple layouts on a large-area substrate, such as a mother OLED backplane substrate, for efficient mass production of OLED panels.

An advantage of the disclosed method is that it produces shadow mask modules with improved mechanical strength over individual shadow masks. The improved mechanical strength can extend the masks' service life and reduce mask breakage, leading to cost reduction in OLED display manufacturing.

Still another advantage of the disclosed method is that it produces shadow mask modules with improved flatness compared to individual shadow masks made without a rigid carrier. The improved flatness of the shadow mask module can reduce the shadowing effect and enhance the quality of patterning, enabling higher pixel densities in OLED displays.

The advantages mentioned above result from the following aspects of the present invention: 1) the alignment of aperture arrays of different shadow masks on the shadow mask module is determined by photolithography steps after bonding rather than the bonding process; 2) without the need of precision alignment during bonding, the numbers of shadow masks tiled in the shadow mask module can be easily extended; 3) the rigid carrier and the adhesion layer provide mechanical support to the shadow masks on the shadow mask module; 4) shadow mask blanks are bonded before the silicon nitride membrane becomes free-standing and thus have less curvature than shadow masks with a free-standing membrane, and the adhesion layer holds the shadow mask blank in place on the rigid carrier during the whole photolithography and etching processes of making the silicon nitride membrane free-standing, thus maintaining the flatness of the formed shadow masks.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within within 20 within 10 or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A shadow mask for patterned vapor deposition of an organic light-emitting diode (OLED) material comprising:
   a ceramic membrane under tensile stress having a thickness of approximately 5 microns or less, the ceramic membrane including:
      a central membrane region with a plurality of through-apertures forming an aperture array through which a vaporized deposition material can pass; and
      a peripheral membrane region surrounding the central membrane region;
   a multilayer peripheral support attached to a rear surface of the peripheral membrane region, with a hollow portion beneath the central membrane region, the multilayer peripheral support having:
      a base layer;
      an interlayer under compressive stress positioned above the base layer and attached to a lower surface of the peripheral membrane region;
      a lower layer under tensile stress positioned beneath the base layer;
   wherein the compressive stress of the interlayer is selected to balance a tensile stress of the ceramic membrane such that the ceramic membrane is maintained in a planar condition.

2. The shadow mask of claim 1, wherein the ceramic membrane includes one or more of silicon nitride, silicon oxide, or silicon oxynitride.

3. The shadow mask of claim 1, wherein the base layer is silicon.

4. The shadow mask of claim 1, wherein the interlayer is selected from one or more of silicon oxide, silicon nitride, silicon oxynitride, aluminum oxide, aluminum nitride, amorphous silicon, polycrystalline silicon, nickel, iron, nickel-iron alloy, or polymer.

5. The shadow mask of claim 1, wherein the thickness of the interlayer is 5 microns or less.

6. The shadow mask of claim 1, wherein the central membrane region is approximately rectangular in shape and a length of a diagonal is approximately 2 cm or more.

7. A shadow mask module comprising:
   a plurality of the shadow masks of claim 1;
   a rigid carrier having a plurality of shadow mask supporting windows, each of the plurality of shadow mask supporting windows having an open portion and a window frame surrounding the open portion, the window frame sized to accommodate the shadow mask such that the central membrane region is positioned in the open portion and the peripheral membrane region with the multilayer peripheral support attached to the rear surface contacts the window frame surrounding the open portion.

8. The shadow mask module of claim 7, further comprising an adhesive layer between the window frame and the multilayer peripheral support.

9. The shadow mask module of claim 8, wherein the adhesive layer includes geometrical spacers.

10. The shadow mask module of claim 7, further comprising an alignment marker on the rigid carrier.

11. The shadow mask module of claim 7, wherein the rigid carrier includes interlocking projections extending from the window frame to engage recesses in the multilayer peripheral support of the shadow mask.

12. The shadow mask module of claim 7, wherein the rigid carrier includes interlocking recesses within the window frame to engage projections from the multilayer peripheral support of the shadow mask.

13. The shadow mask module of claim 7, further comprising an edge support positioned on the rear surface of the shadow mask on the peripheral membrane region adjacent to the central membrane region.

14. The shadow mask module of claim 7, wherein the ceramic membrane is silicon nitride, silicon oxide, or silicon oxynitride.

15. The shadow mask module of claim 7, wherein the base layer is silicon.

16. The shadow mask of claim 7, wherein the interlayer is selected from one or more of silicon oxide, silicon nitride, silicon oxynitride, aluminum oxide, aluminum nitride, amorphous silicon, polycrystalline silicon, nickel, iron, nickel-iron alloy, or polymer.

17. A method for making the shadow mask module of claim 7, comprising:
providing the rigid carrier having the plurality of shadow mask supporting windows, each of the plurality of shadow mask supporting windows having the open portion and the window frame surrounding the open portion, the window frame sized to accommodate the shadow mask;
positioning a shadow mask blank in each of the plurality of shadow mask supporting windows of the rigid carrier, and bonding each of the shadow mask blanks to each of the window frames, respectively, each of the shadow mask blanks including:
the ceramic membrane upper layer under tensile stress having the thickness of approximately 5 microns or less; and
the base layer;
the interlayer under compressive stress;
the lower layer under tensile stress positioned beneath the base layer;
etching a shadow mask pattern of perforations in each of the ceramic membrane upper layers to define a central patterned membrane region and an unpatterned peripheral membrane region;
removing the base layer, interlayer, and lower layer in a region beneath the central patterned membrane region such that the shadow mask is formed with an unsupported central patterned membrane region and a supported unpatterned peripheral membrane region.

18. The method for making a shadow mask module according to claim 17, wherein bonding each of the shadow mask blanks to each of the window frames comprises applying the adhesive between the shadow mask blank and the window frame, respectively.

19. The method for making a shadow mask module according to claim 17, wherein the etching a shadow mask pattern of perforations in each of the ceramic membrane upper layers to define a central patterned membrane region and an unpatterned peripheral membrane region comprises a photolithography process.

20. The method for making a shadow mask module according to claim 17, wherein the base layer is silicon and the base layer is removed by a potassium hydroxide etchant, a tetramethylammonium hydroxide etchant, or reactive ion etching.

21. The method for making a shadow mask module according to claim 17, wherein the rigid carrier is fabricated from glass and the bonding is anodic bonding.

* * * * *